(12) United States Patent
Das Sharma (10) Patent No.: US 7,096,414 B2
(45) Date of Patent: Aug. 22, 2006

(54) IN-LINE WIRE ERROR CORRECTION (75) Inventor: Debendra Das Sharma, Santa Clara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 479 days.

(21) Appl. No.: 10/632,908

(22) Filed: Aug. 4, 2003

(65) Prior Publication Data

US 2005/0034052 A1 Feb. 10, 2005

(51) Int. Cl.
*G06F 11/00* (2006.01)
(52) U.S. Cl. ...................................... 714/800; 714/785
(58) Field of Classification Search ................ 711/213; 714/758, 753, 49, 800, 801, 785
See application file for complete search history.

(56) References Cited

U.S. PATENT DOCUMENTS

| 4,729,092 | A | * | 3/1988 | Lupton | ....................... 711/213 |
|---|---|---|---|---|---|
| 5,157,669 | A | | 10/1992 | Yu et al. | |
| 5,517,509 | A | | 5/1996 | Yoneda | |
| 5,734,663 | A | | 3/1998 | Eggenberger | |
| 5,768,296 | A | | 6/1998 | Langer et al. | |
| 5,787,095 | A | | 7/1998 | Myers et al. | |
| 6,092,231 | A | * | 7/2000 | Sze | ........................... 714/758 |
| 6,147,827 | A | | 11/2000 | Southerland et al. | |
| 6,223,309 | B1 | | 4/2001 | Dixon et al. | |
| 6,473,877 | B1 | * | 10/2002 | Sharma | ...................... 714/753 |
| 6,961,877 | B1 | * | 11/2005 | Si et al. | ........................ 714/49 |

* cited by examiner

*Primary Examiner*—David Ton (57) ABSTRACT

An error correction scheme for transmission of electronic data using an in-line error correction where there are no explicit wires for error correction code (ECC) bits. A method for in-line error detection and correction is described which uses 0 to k wires, and symbols 0 to n, where information bits and symbols are sent along wires 0 to k. Before sending an information block along wires 0 to k, check bits are calculated from the information bits, wherein the check bits are made up of horizontal parity, extended parity and overall parity of the information. The check bits are sent along wires 0 to k, using the same wires as for the information bits.

8 Claims, 11 Drawing Sheets

$$\text{wire no.} \quad 17 \; 16 \; 15 \; 14 \; 13 \; 12 \; 11 \; 10 \; 9 \; 8 \; 7 \; 6 \; 5 \; 4 \; 3 \; 2 \; 1 \; 0$$

$$H = \begin{bmatrix} 1 & 1 & 1 & 1 & 1 & 1 & 1 & 1 & 1 & 1 & 1 & 1 & 1 & 1 & 1 & 1 & 0 & 1 \\ \alpha^{15} & \alpha^{14} & \alpha^{13} & \alpha^{12} & \alpha^{11} & \alpha^{10} & \alpha^{9} & \alpha^{8} & \alpha^{7} & \alpha^{6} & \alpha^{5} & \alpha^{4} & \alpha^{3} & \alpha^{2} & \alpha & 1 & 1 & 0 \end{bmatrix}$$

FIG. 1 (PRIOR ART)

$$\text{wire no.} \quad \cdots \; 4 \; 3 \; 2 \; 1 \; 0$$

$$H = \begin{bmatrix} \cdots & 1 & 1 & 1 & 0 & 1 \\ \cdots & \alpha^{B+2} & \alpha^{B+1} & \alpha^{B} & 1 & 0 \end{bmatrix}$$

IN-LINE WIRE ERROR CORRECTION

TECHNICAL FIELD

The invention relates generally to error correction schemes for transmission of electronic data and, more particularly, to in-line error correction where there are no explicit wires for error correction code (ECC) bits.

BACKGROUND

With the communication of large amounts of electronic data comes the probability of data errors. These errors can be caused by a variety of phenomenon: noisy communication media, electronic interference, sun spots, faulty communication lines, broken wires, etc. As improvements are made in the information technology industry, various methods of error correction, also known as error correction code (ECC) have been developed and used to minimize communication errors. Data rates have been increasing almost exponentially between CPUs and memory, as well as transmitted between nodes. It is critical that data retrieved from memory, as well as transmitted data, be deemed reliable, i.e., free from errors.

There are typically two parts to ECC schemes: detecting errors and correcting detected errors. In some applications that are not time critical, detection of an error may result simply in the data being re-sent, rather than corrected. This method is too slow for most applications. In other applications, error correction takes place in software. This method is also too slow for many applications.

SUMMARY

A system is described herein which uses an in-line wire error correction scheme. A method for in-line error detection and correction is described which uses 0 to k wires, and symbols 0 to n, where information bits and symbols are sent along wires 0 to k. Before sending an information block along wires 0 to k, check bits are calculated from the information bits, wherein the check bits are made up of horizontal parity, extended parity and overall parity of the information. The check bits are sent along wires 0 to k, using the same wires as for the information bits.

When the information block, or frame, is received, it needs to be determined whether an error exists in the sent information. Syndromes are generated from the check bits and compared, wherein syndrome 0 is obtained from the horizontal parity (HP) bits by taking an exclusive-OR (XOR'ing) of the information bits with the HP bits and wherein syndrome 1 comprises a degree n−1 polynomial. Single wire error correction is performed, when necessary, the wire and bits in error being determined using the syndromes.

DESCRIPTION OF THE DRAWINGS

The detailed description will refer to the following drawings, wherein like numerals refer to like elements, and wherein.

DETAILED DESCRIPTION

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Existing schemes require two wires to carry the ECC bits. However, many cabling solutions may preclude the use of extra wires beyond ones dedicated for information. The present mechanism provides the capability to do wire error correction without requiring separate wires for the ECC bits.

The present mechanism extends the ECC to work as an in-line ECC. The present scheme uses the same H-matrix as that existing in literature. The present mechanism extends that H-matrix to make it work as an in-line error correcting code (ECC), rather than a side band. An exemplary wire error correct code is laid out as shown below:

$$\text{wire number } 17\ 16\ 15\ 14\ 13\ 12\ 11\ 10\ 9\ 8\ 7\ 6\ 5\ 4\ 3\ 2\ 1\ 0$$

$$H = \begin{bmatrix} 1 & 1 & 1 & 1 & 1 & 1 & 1 & 1 & 1 & 1 & 1 & 1 & 1 & 1 & 1 & 1 & 0 & 1 \\ \alpha^{15} & \alpha^{14} & \alpha^{13} & \alpha^{12} & \alpha^{11} & \alpha^{10} & \alpha^9 & \alpha^8 & \alpha^7 & \alpha^6 & \alpha^5 & \alpha^4 & \alpha^3 & \alpha^2 & \alpha & 1 & 1 & 0 \end{bmatrix}$$

where $\alpha$ is the root of a primitive polynomial of degree n, and n being the number of check bits.

There are two wires (0 & 1) that carry the ECC bit. Eight (8) symbols make a logical entity called a block or a "flit". Wire 0 represents the parity horizontally (HP, or horizontal parity). It is the parity of all the bits in wires 2 ... 17. Wire 1 carries an extended parity (EP) which is a Galois field operation over the 128 information bits. A primitive polynomial of degree 8 is used. One could go down to degree s and need only s bits of wire 1. Each of the information bits has a power of the root of the primitive polynomial $\alpha$. When a wire error occurs, the horizontal parity of the bits identifies the bits in error and the extended parity bits identify the failing wire.

Existing Scheme

Figure 1:
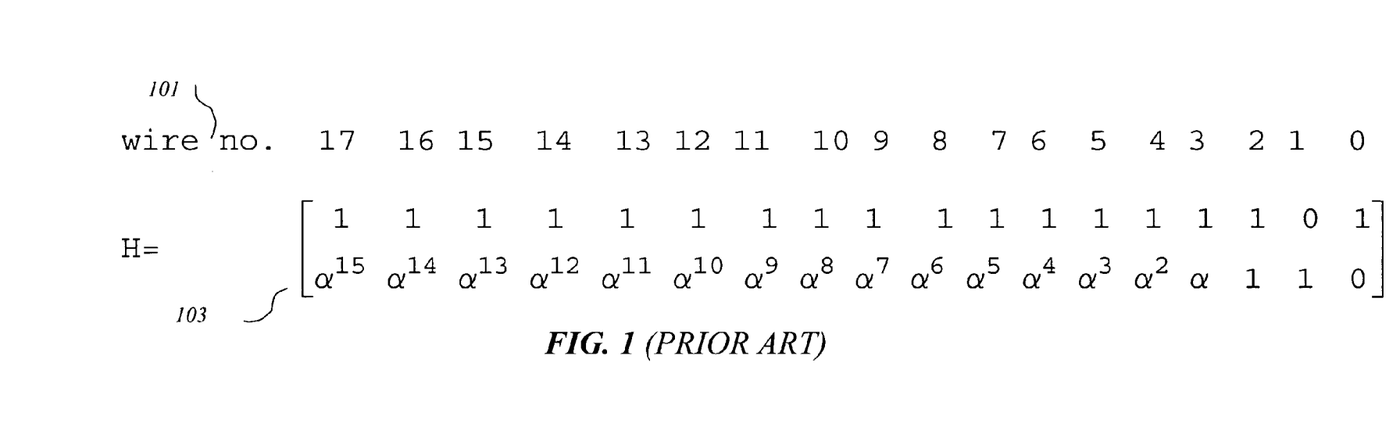
FIG. 1 shows an H-matrix representation of wires for an ECC scheme.
Figure 2:
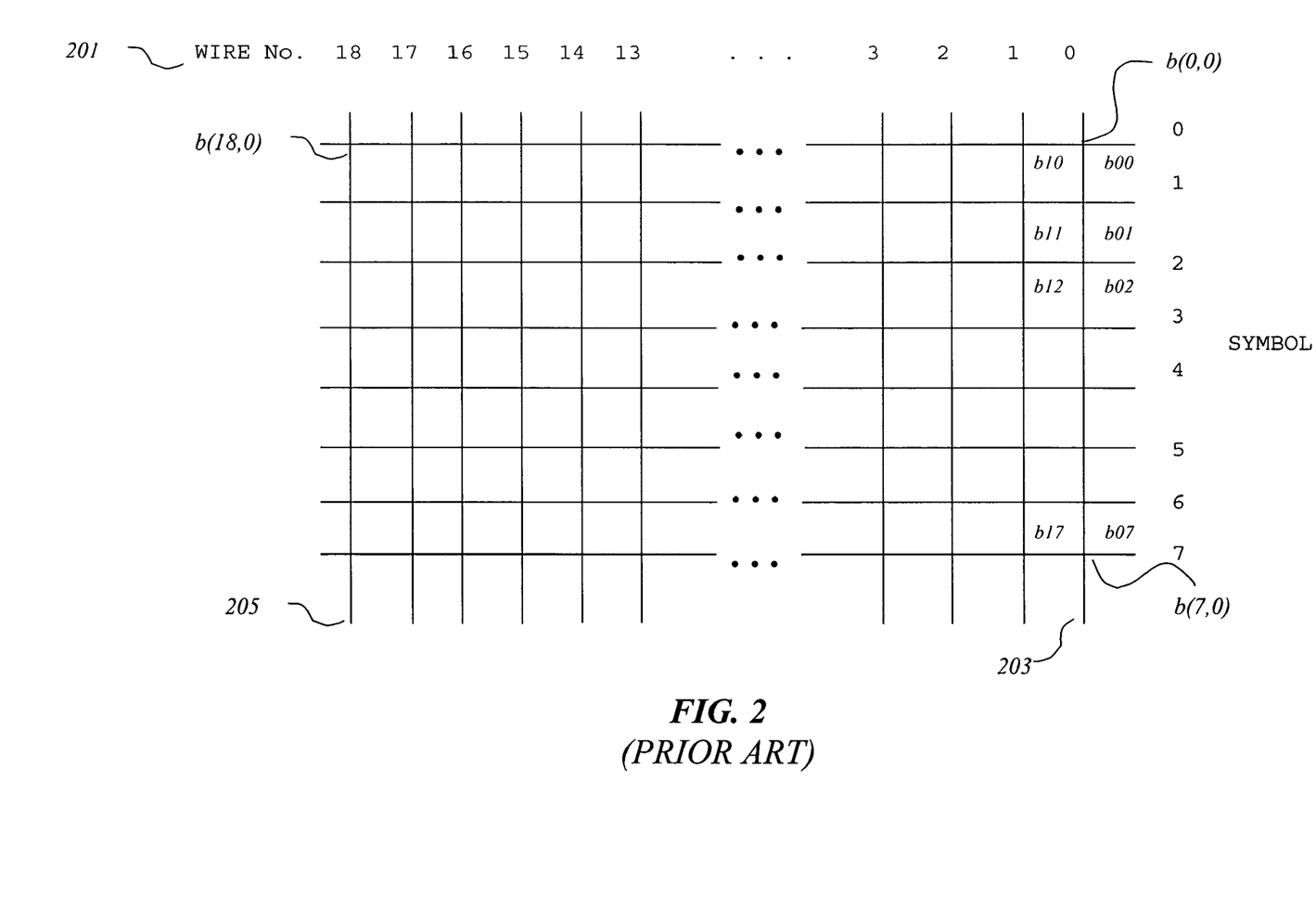
FIG. 2 shows a representation of a 19-wire data path, for wires 0 through 18.

Referring to FIG. 1, there is shown an H-matrix representation of wires for an ECC scheme. The wire number 101 is shown above the first row. The second row 103 shows the H matrix. For instance, ax is the root of a primitive polynomial of degree n, where n is the number of check bits. FIG. 2 shows a representation of a 19-wire data path 201, wires 0 through 18. Wire 0 (203) is the rightmost wire and wire 18 (205) is the leftmost wire. There are also shown (8) symbols 207, 19 bits wide, each (also known as a flit). Thus, the scheme provides 8×19=152 bits, where there are 8×17 bits of information and 2 wires are for error correction (ECC). Wire 0 carries the horizontal parity of the bits in wires 2 through 18. The 8-bits in wire 1 are the various polynomial weights of the other wires. In other words, the contents of wire 1 are represented as $$(b_{10}, b_{11}, b_{12}, \ldots, b_{17}) = \sum_{x=2}^{18} \sum_{y=0}^{7} b_{xy} \alpha^{(x+y-2)}$$

$$= (b_{10} + b_{11}\alpha + b_{12}\alpha^2 + \ldots + b_{17}\alpha^7)$$

When an error occurs, for instance in wire j (where $2 \leq j \leq 18$), the horizontal parity indicates, derived from wire 0, which bits in the wire have an error $[e_0, e_1, \ldots, e_7]$. Wire 1 is used to find out the $\alpha^j [e_0 + e_1\alpha + e_2\alpha^2 + \ldots + e_7\alpha^7]$ and identify j uniquely.

For wire 0, there are two (2) syndromes, referred to herein as "synd," calculated. For purposes of this discussion, the "$\oplus$" symbol indicates Galois Field (GF(2)) addition, or taking the exclusive or (XOR) of the bits.

$$\text{synd } 0 = \begin{cases} b_{00} \oplus b_{20} \oplus b_{30} \oplus \ldots \oplus b_{18,0}, & (e_0) \\ b_{01} \oplus b_{21} \oplus b_{31} \oplus \ldots \oplus b_{18,1}, & (e_1) \\ b_{07} \oplus b_{27} \oplus b_{37} \oplus \ldots \oplus b_{18,7}, & (e_7) \end{cases}$$

For wire 1, $$\text{synd } 1 = (b_{10} + b_{11}\alpha + b_{12}\alpha^2 + \ldots + b_{17}\alpha^7) + \sum_{x=2}^{18}\sum_{y=0}^{7} b_{xy}\alpha^{(x+y-2)},$$

where all powers of
$\alpha=0$ through 7 are added independently following GF(2) addition, i.e., XOR'ed (exclusive OR'ed).

If an error occurs in wire j=1, synd 0 is zeroes, but synd 1 is non-zero. The bits with non-zero powers of a can be flipped if it is desired to recover wire 1.

For j=0, synd 1=0, but synd 0 is non-zero.

In this document, the contents of wire 0 are called horizontal parity (HP). The contents of wire 1 are called extended parity (EP).

In-Line Method

Figure 3:
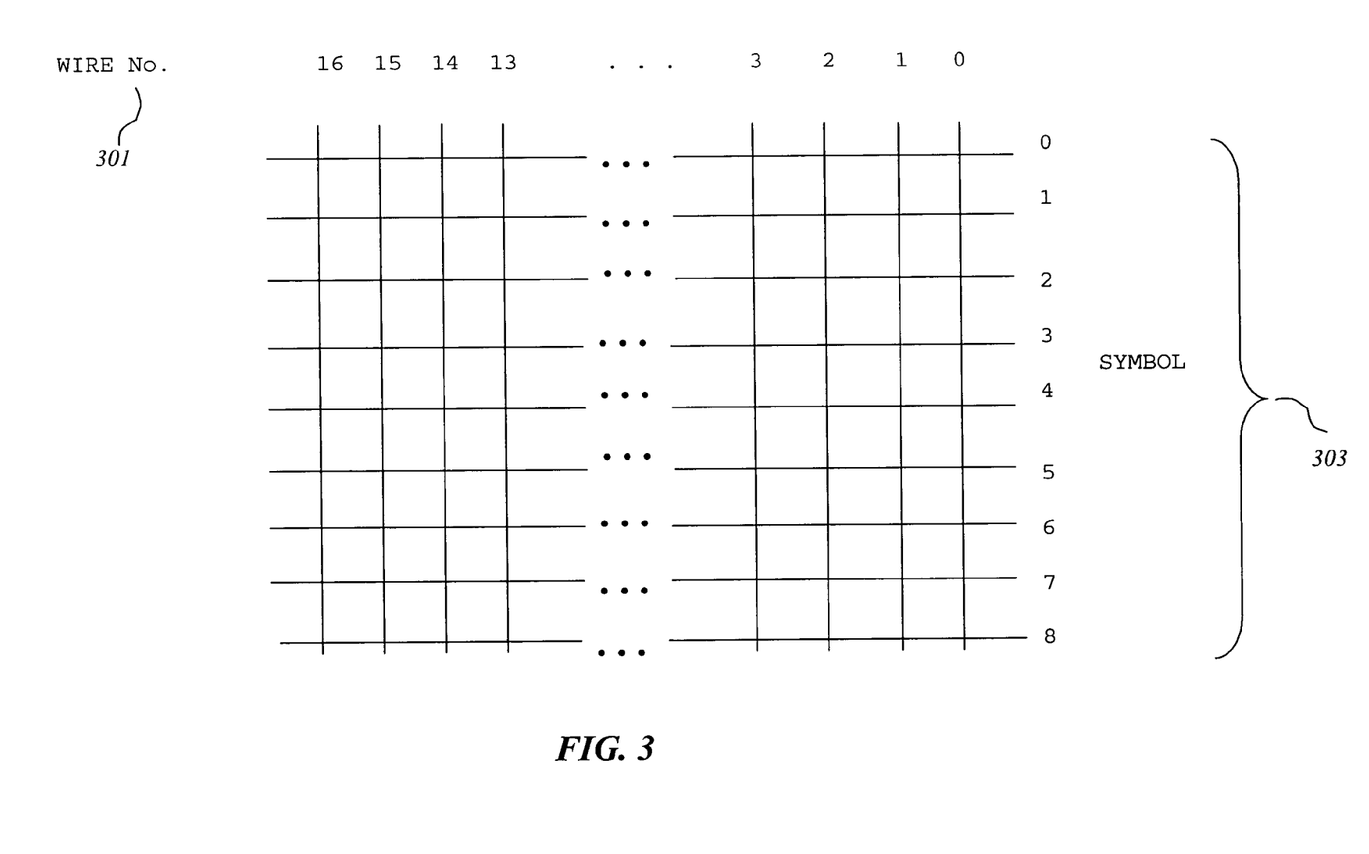
FIG. 3 shows a representation of a 17-wire data path, for wires 0 through 16, and symbols 0 through 8.

Instead of having two dedicated wires for ECC, up to one additional symbol, or more if desired, is used instead. Referring to FIG. 3, there are shown wires 0 through 16 (301), and symbols 0 through 8 (303). Here, the code word is 8×17 bits of information (136 bits), and 17 bits for ECC. Symbol 8 carries the ECC, as shown below. The 16 ECC bits are generated using the same mechanism as described above. An extra bit is added as the overall parity for the 16 ECC bits to result in 17 bits of ECC.

symbol 8:
wire 16 15 14 13 12 11 10 9 8 7 6 5 4 3 2 1 0
|EP$_7$EP$_6$EP$_5$EP$_4$EP$_3$EP$_2$EP$_1$EP$_0$|HP$_7$HP$_6$HP$_5$HP$_4$HP$_3$H$_2$HP$_1$HP$_0$|OP
where,
OP=EP$_7 \oplus$ EP$_6 \oplus$ EP$_5 \oplus$ EP$_4 \oplus$ EP$_3 \oplus$ EP$_2 \oplus$ EP$_1 \oplus$ EP$_0 \oplus$ HP$_7 \oplus$ HP$_6 \oplus$ HP$_5 \oplus$ HP$_4 \oplus$ HP$_3 \oplus$ HP$_2 \oplus$ HP$_1 \oplus$ HP$_0$ One overall parity bit is needed for each symbol, where there are ECC bits. Thus, in an alternative embodiment, if there are 18 bits of ECC, then 16 bits of ECC and one OP bit are used in symbol 8, and two (2) bits of ECC and one (1) OP bit in symbol 9 with the remainder of symbol 9 being all zeroes. The OP bit indicates whether the ECC bits, including the OP, have been corrupted, or not. If the ECC symbol has not been corrupted, then the same decode mechanism with the 16 ECC bits can be used, as described above, except that the only cases considered are where the information bits and not the ECC are affected.

If the OP bit indicates an error, then an error is assumed along each of the wires individually. For instance, if it is assumed that wire 1 is erroneous, then HP$_0$ needs to be flipped to obtain the modified ECC bits. Once the modified ECC has been obtained, error correction is performed, if appropriate. The synd 0 is obtained from the horizontal parity bits by taking the exclusive-OR (XOR'ing) of the information bits with the HP bits as follows:

Assuming wire 1 has an error:
HP$_0^1$=OP$\oplus$HP$_1\oplus$ ... $\oplus$ HP$_7\oplus$EP$_0\oplus$ ... $\oplus$EP$_7$ and
HP$_1^1$=HP$_1$, HP$_2^1$=HP$_2$, ... EP$_0^1$=EP$_0$, EP$_1^1$=EP$_1$, ... EP$_7^1$=EP$_7$.

Similarly, assuming wire j is in error the real ECC bits can be derived according to HP$_0^1$, HP$_1^1$, ... HP$_7^1$, EP$_0^1$, ... EP$_7^1$. Next, the error in each row n (for n=0.7) is calculated as follows:
$e_n = b_{is,n} \oplus b_{is,n} \oplus \ldots \oplus b_{0,n} \oplus HP_n^1$.

All the $e_n$'s make synd 0. Synd 1 is obtained by $$(EP_2^1 + EP_1^1\alpha + EP_2^1\alpha^2 + \cdots + EP_7^1\alpha^7) + \sum_{\substack{n=0 \\ n \neq j}}^{16}\sum_{y=0}^{7} b_{xy}\alpha^{(n+y+B)} + \sum_{y=0}^{7} b_{jy}^{1,j+y+B}$$

where $b_{jy}^1 = b_{jy} \oplus \alpha_j$.

If wire j had an error, then synd 1 should equal 0, since wire j has already been corrected by adding the $e_y$ values. If synd 1 is not 0, then the error is not in wire j, but in some other wire. If the ECC is spread over multiple symbols, then a wire error is still assumed, if one of the symbols' OP does not match; otherwise, the ECC bits are assumed to be error free.

Figure 4:
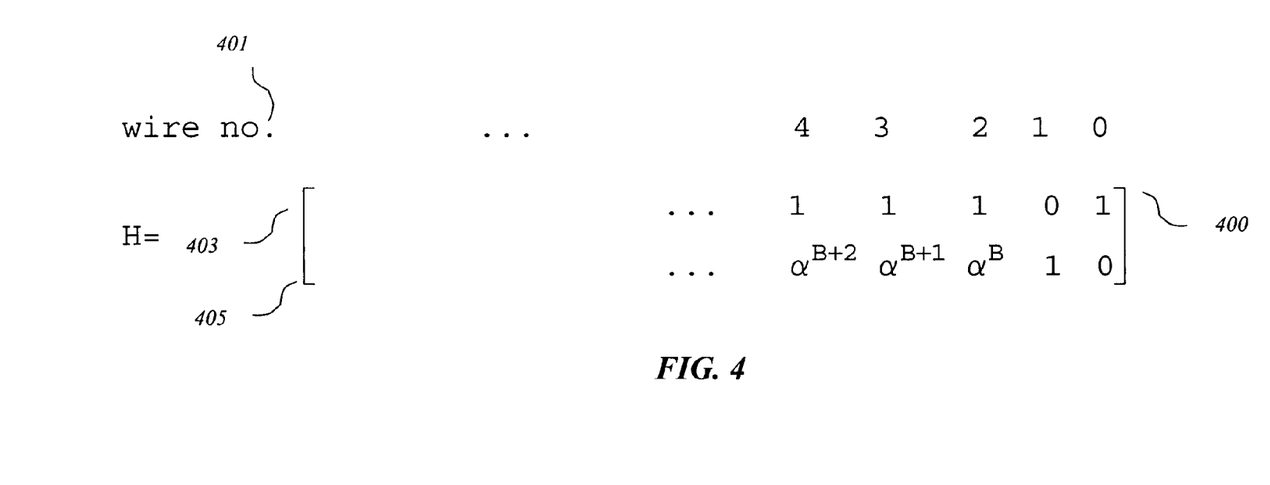
FIG. 4 shows an H-matrix for an exemplary embodiment of the in-line wire method.

Referring now to FIG. 4, there is shown the H-matrix for an embodiment of the in-line wire method. The wire number 401 is indicated above the columns of the matrix 400. The first two columns are not wires, as was the case with methods of the prior art. The first two columns of the matrix 400 are parity bits going in all wires and an overall parity bit, respectively. B is the number of bits in the HP or EP. Row 1 (403) of the H-matrix 400 gives the horizontal parity bits HP[ ]. Row 2 (405) of the H-matrix 400 gives the extended parity bits EP[ ]. The number of bits (13) for HP[ ] and EP[ ] is the same and is given by the equation B=the degree of primitive polynomial+1 for an embodiment of the present method. The present method starts at $\alpha^B$ rather than one (1) in the third column in order to avoid aliasing since the same wire error affects data as well as ECC bits.

In the method of the prior art, wire 0 can carry all of the HP bits. Wire 1 can carry all of the EP bits and wires 2 ... n can carry all of the information bits. In the present method, no dedicated wires are available to carry the ECC bits, unlike the prior art method where wires 0 and 1 carried the ECC bits. Thus, all EP and HP travel in the same wires as data.

An overall parity bit (OP) is needed for each symbol that carries HP and/or EP bits. The OP bit should be placed in the same symbol. The following definitions are to be understood in the description of the figures:

The number of wires is 17, wire 0 through wire 16. The number of symbols, B, is 8. All of the EP and HP bits along with the OP bit fit in one symbol. Two alternative embodiments are contemplated, as described below.

Case (1): (EP, HP, OP) occupy less than one symbol. In this case, it is assumed that the rest of the bits in the symbol carry information bits, as shown below.

| wires | 15 14 13 ... 2 1 0 |
|---|---|
| symbol 0: | d2 d1 d0 e5 e4 e3 e2 e1 e0 h5 h4 h3 h2 h1 h0 OP |
| Powers: | $\alpha 18 \, \alpha 17 \, ... \, \alpha 5 \, \alpha 4 \, \alpha 3$ |

The same principles are applied by acting as if symbol 0 is really two (2) symbols. One set is for {0 0 0 e5 e4 ... e0 h5 ... h0 ... OP} and the other set is for {d2 d1 d0 0 0 ... 0}.

Case (2): {HP, EP} combined with OP goes over multiple symbols. Here, one OP bit is needed per symbol. The OP bit in each symbol is an XOR (exclusive OR) of the HP/EP bits in that symbol only. The method describes a need to account for the fact that one wire error may affect zero, one or more number of HP/EP bits and the method needs to be modified to account for these cases. Depending on the number of symbols that have these HP/EP bits, the method would vary since they cover different permutations. However, the same principles apply.

The reason for starting with $\alpha^B$ in the present method is that an error in the EP bits cannot alias to a no-error case. This is required when one is trying to inject an error in all wire positions if the overall parity indicates there is an error in the HP/EP bits.

In case (2) above, where there are multiple symbols, care must be taken while choosing the H-matrix that any combination of EP bits that are placed along a wire is not a valid power of $\alpha$ in the H-matrix. Further, multiple EP bits along a wire should be avoided, if possible.

The same decode mechanism is used with the 16 bits as described above, except only cases where the information bits and not the ECC bits are affected are considered. If the OP bit indicates an error, then an error is assumed along each of the wires individually, and then get the modified ECC. For example, if wire 1 is assumed to be erroneous, then the $HP_0$ bit is flipped to obtain the modified ECC bits.

Once the modified ECC bits are obtained, then error correction is performed, if appropriate. From the horizontal parity bits, the synd 0 is obtained by XOR'ing the information bits with the HP bits, (e.g., $e0=b_{16,0} \oplus b_{15,0} \oplus$ ... $\oplus b_{10} \oplus b_{00} \oplus HP'_0$). The modified ECC is obtained, assuming wire j is in error. Next, synd 1 is obtained (e.g., $$(EP'_0 + EP'_1 \alpha + ... + EP'_7 \alpha^7) + \left( \sum_{x=0}^{16} \sum_{y=0}^{7} b_{xy} \alpha^{(x+y+B)} \right) + (e_0 + e_1 \alpha + ... + e_7 \alpha^7) \alpha^B.$$

If wire j has an error, then synd 1 should be equal to zero since the contents of wire j have already been corrected by adding the ey values. If synd 1 is not zero, the error is not in wire j, but some other wire. If the ECC is spread over multiple symbols, then an error is still assumed to be in a wire, provided that one of the symbols' OP does not match; otherwise, the ECC bits are assumed to be error-free.

In the present mechanism, all of the horizontal parity and extended parity bits are used. However, the wire error may affect not only the information or ECC bits, but both. The ECC scheme may break down. The overall parity bit is used in each symbol that contains the ECC bits. Assuming the overall parity bit fails, the horizontal parity is checked to get the bits in error within a wire (if any) and use the extended parity bits to identify the wire in error (if any) using the same algorithm. If the overall parity indicates that there is an error in the ECC bits, then first assume wire 0 is in error independently, correcting the ECC bit corresponding to the wire that is presumed to have failed and apply the horizontal parity to find the bits in error. Based on the erroneous bits, find what the extended parity bits should be and compare them with the extended parity bits. If the extended parity bits match with what was projected for a failed wire, then the failed wire and the failed bits within it are identified. The correct data can also now be identified. If the overall parity bit does not indicate a failure, then the HP and EP bits are assumed to be correct and the original ECC scheme is applied.

Figure 5:
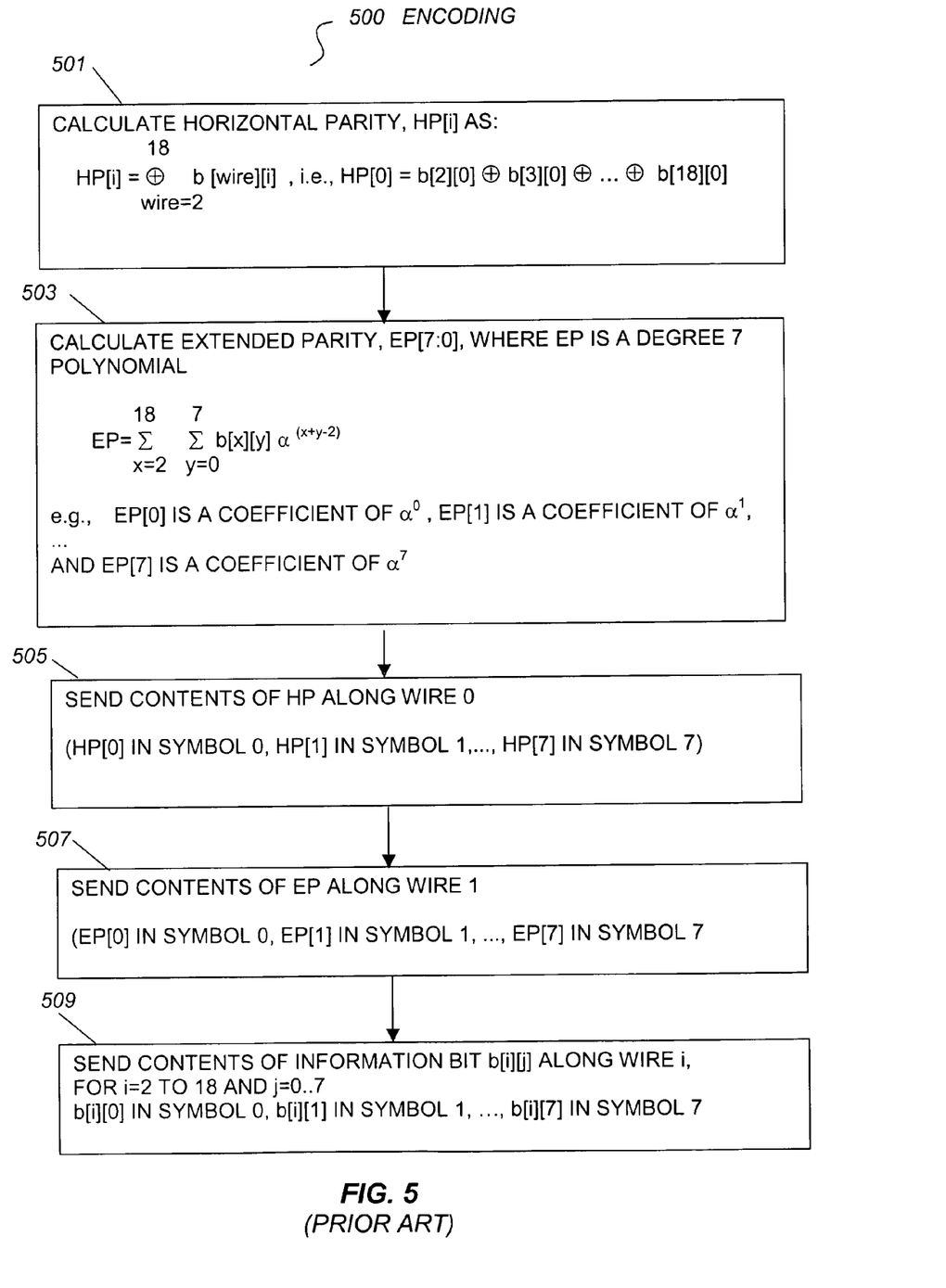
FIG. 5 shows a flow chart of a method of the prior art for encoding the ECC bits.

Referring now to FIG. 5, there is shown a flow chart of a prior art method 500 for encoding the ECC bits. First the horizontal parity HP[i] is calculated in step 501, as $$HP[i] = \bigoplus_{wire=2}^{18} b[wire][i],$$

i.e., HP[0]=b[2][0]$\oplus$+b[3][0]$\oplus$ ... $\oplus$b[18][0]. Then the extended parit calculated in step 503 as EP[7:0], where EP is a degree 7 polynomial. Thus, $$EP = \sum_{x=2}^{18} \sum_{y=2}^{7} b[x][y] \alpha^{(x+y+2)},$$

such that EP[0] is a coefficient of $\alpha^0$, EP[1] is a coefficient of $\alpha^1$, ..., and EP[7] is a coefficient of $\alpha^7$. The contents of the horizontal parity (HP) are then sent along wire 0 in step 505, such that HP[0] is in symbol 0, HP[1] is in symbol 1, ..., and HP[7] is in symbol 7. The contents of the extended parity (EP) are then sent along wire 1 in step 507, such that EP[0] is in symbol 0, EP[1] is in symbol 1, ..., and EP[7] is in symbol 7. Finally, the information bits b[i] are sent along wire i, for i=2 to 18, in step 509.

Figure 6A:
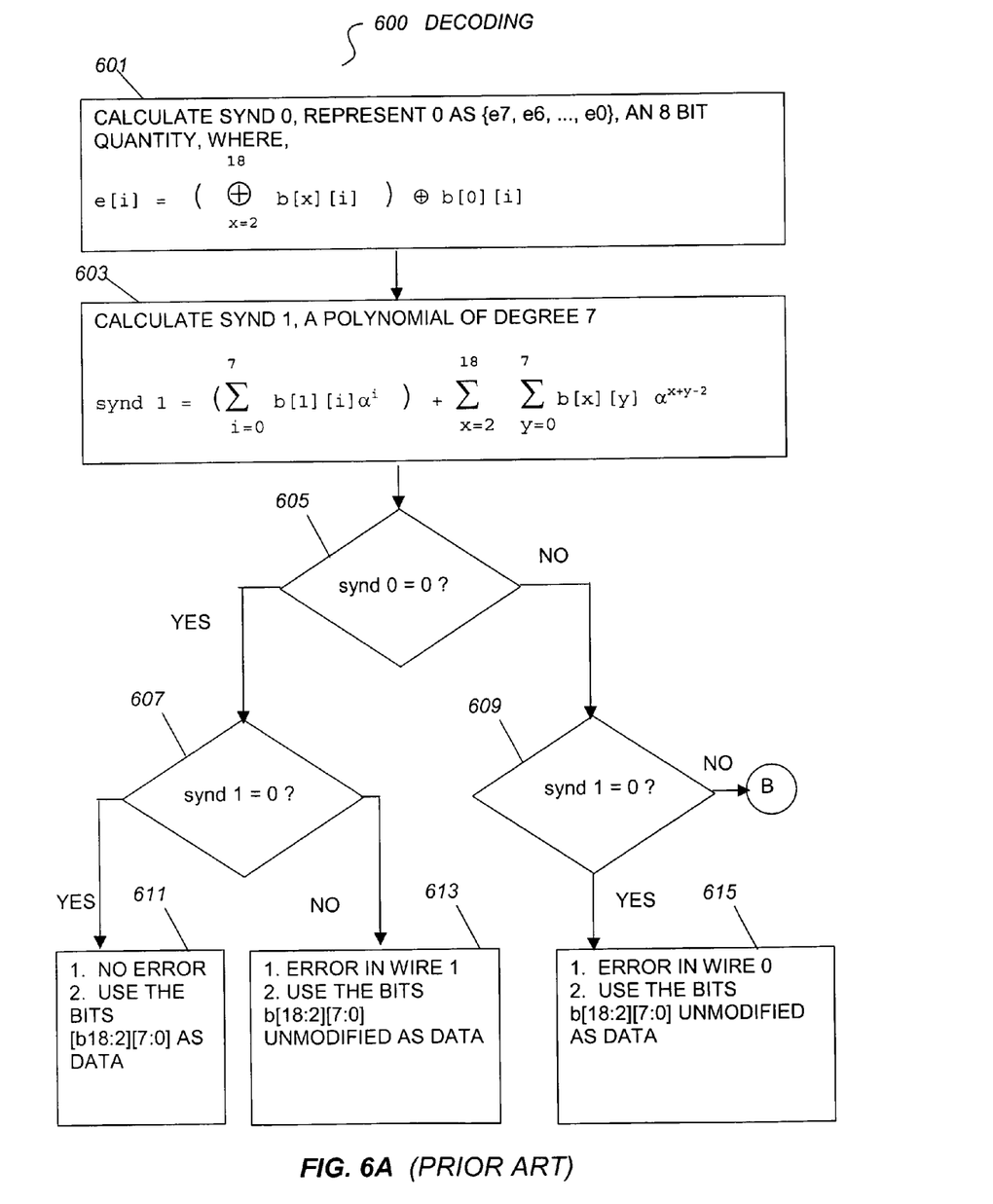
FIGS. 6A and 6B is a flow chart of a method of the prior art for decoding the ECC and information bits.
Figure 6B:
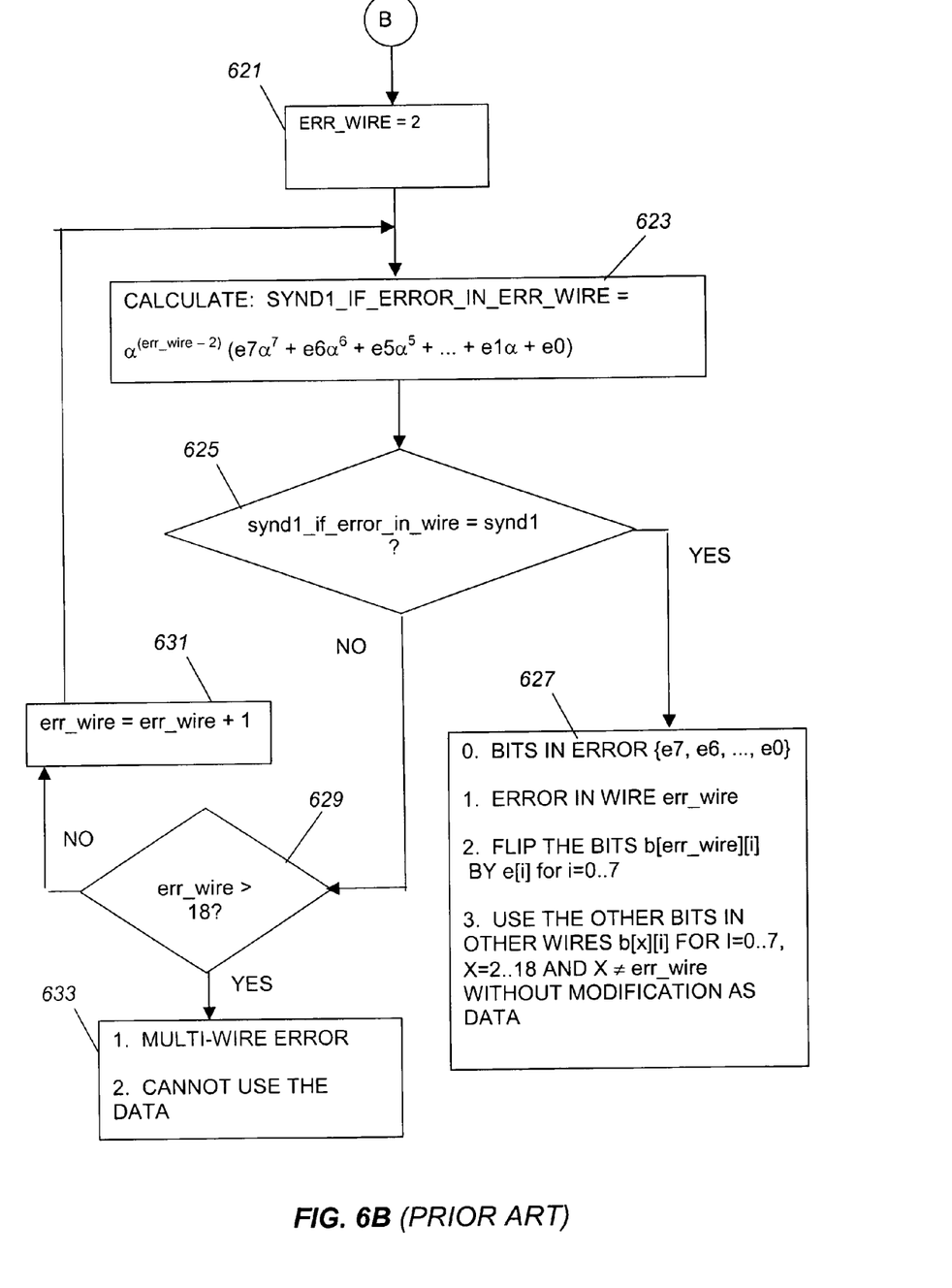

FIGS. 6A and 6B illustrate the method of the prior art to decode the bits sent via the method as shown in FIG. 5.

Referring now to FIG. 6A, the syndrome 0 (synd0) is calculated in step 601 as an 8-bit quantity where $$e[i] = \left(\bigoplus_{x=2}^{18} b[x][i]\right) \oplus b[0][i].$$

Syndrome 1 (synd1), a polynomial of degree 7 is calculated in step 603 as $$synd1 = \left(\sum_{i=0}^{7} b[1][i]\alpha^i\right) + \sum_{x=2}^{18}\sum_{y=0}^{7} b[x][y]\alpha^{x+y-2}.$$

A determination is made as to whether synd0 is zero in step 605. A determination is made as to whether synd1=0 in steps 607 or 609. If synd0=1 and synd1=0 then there is no error and the bits b[18:2][7:0] are used in step 611. If synd0=0 and synd1=1 then there is an error in wire 1 and the bits b[18:2][7:0] are used as modified data in step 613. If synd0≠0 and synd1=0 then there is an error in wire 0 and the bits b[18:2][7:0] are used as modified data in step 615. However, if synd0≠0 and synd1≠0, then there is an error in one of the information wires that must be corrected.

Referring now to FIG. 6B, the error correction method of the prior art is shown. An execution loop is performed beginning in step 621 where err_wire is initialized to 2 and assumed to be in error. First synd1 is calculated for the err_wire in step 623 as $\alpha^{(err\_wire)}$ (e7$\alpha^7$+e6$\alpha^6$+e5$\alpha^1$+e4$\alpha^4$+e3$\alpha^3$+e2$\alpha^2$+e1$\alpha^1$+e0). If the synd1 of err_wire is equal to the synd1, as determined in step 625, then there are bits in error in wire err-wire. The bits b[err-wire][i] are flipped by e[i] for i=1 to 7, in step 627. The other bits in other wires are used without modification as data. However, if the synd1 of err_wire is not equal to the synd1, then if err_wire is less than or equal to 18 (last wire), as determined in step 629, then err_wire is incremented by 1 in step 631 and the synd1 of the err_wire is recalculated in step 623. The loop continues until the wire in error and associated erroneous bits are determined and corrected. However, if err_wire is greater than 18 at this point, there is a multi-wire error and the data cannot be uses, as shown in step 633.

Figure 7:
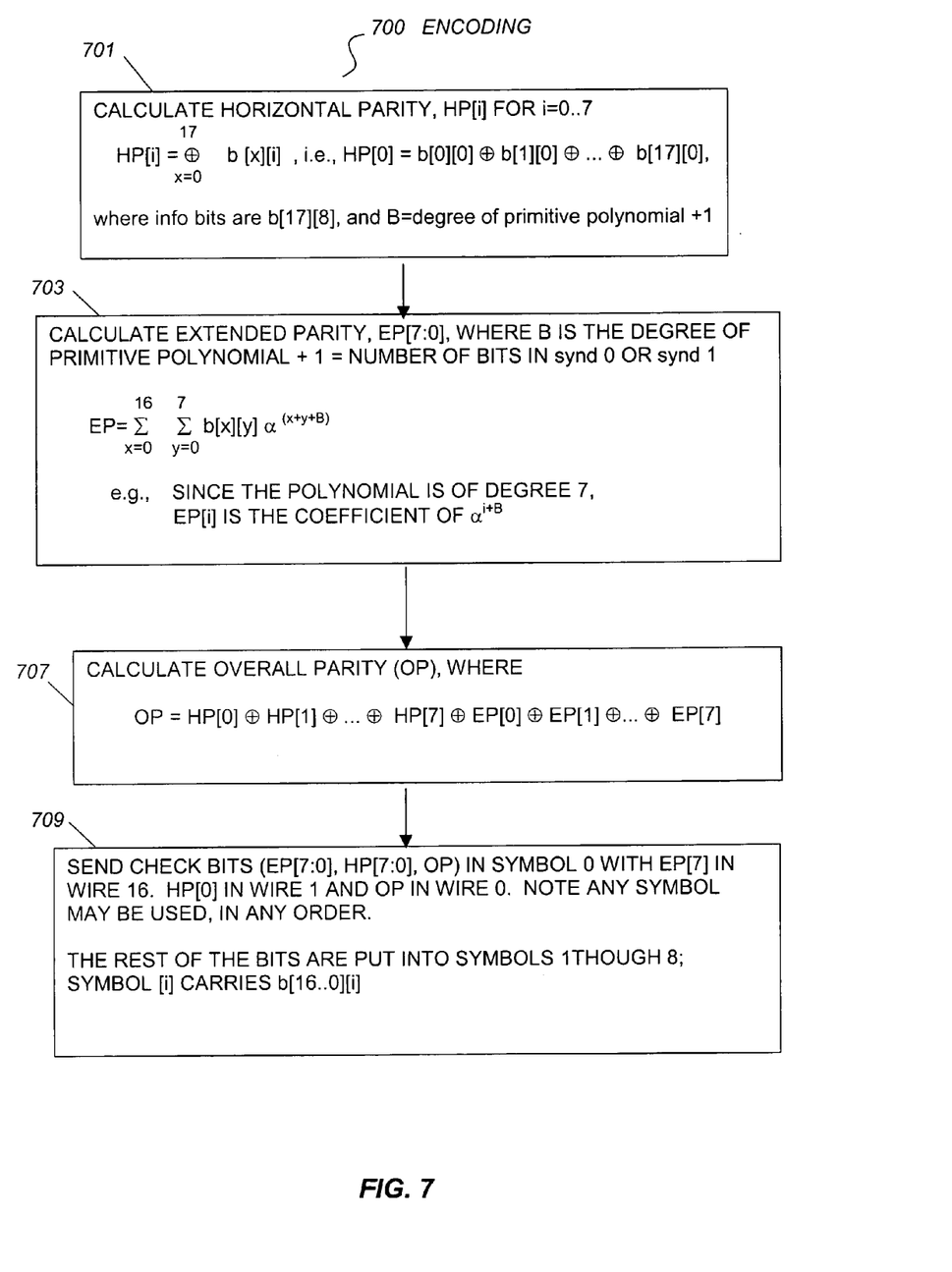
FIG. 7 is a flow chart of an exemplary method for encoding the ECC and information bits for in-wire ECC by calculating horizontal, extended and overall parity.

FIG. 7 shows a method for in-line wire error correction encoding of information bits. Referring now to FIG. 7, the horizontal parity is calculated in step 701, as $$HP[i] = \bigoplus_{x=0}^{17} b[x][i], \text{ i.e., } HP[0] = b[0][0] \oplus b[1][0] \oplus \ldots \oplus b[17][0].$$

The extended parity, EP[7:0], is then calculated in step 703 as, $$EP = \sum_{x=0}^{16}\sum_{y=0}^{7} b[x][y]\alpha^{x+y+B},$$

and where EP[i] is the coefficient of $\alpha^{x+B}$. The contents of HP are then sent along wire 0 in step 705, such that such that HP[0] is in symbol 0, HP[1] is in symbol 1, ..., and HP[7] is in symbol 7. The overall parity (OP) is then calculated in step 707, where OP=HP[0]⊕HP[1]⊕ ... ⊕HP[7]⊕EP[0]⊕EP[1]⊕ ... ⊕EP[7]. Check bits (EP[7:0], HP[7:0], OP) are sent in symbol 0, in step 709, where EP[7] is in wire 16, HP[0] is in wire 1 and OP is in wire 0. The rest of the bits are put into symbols 1 to 8. Thus, symbol i carries bits b[16 ... 0][i].

Figure 8A:
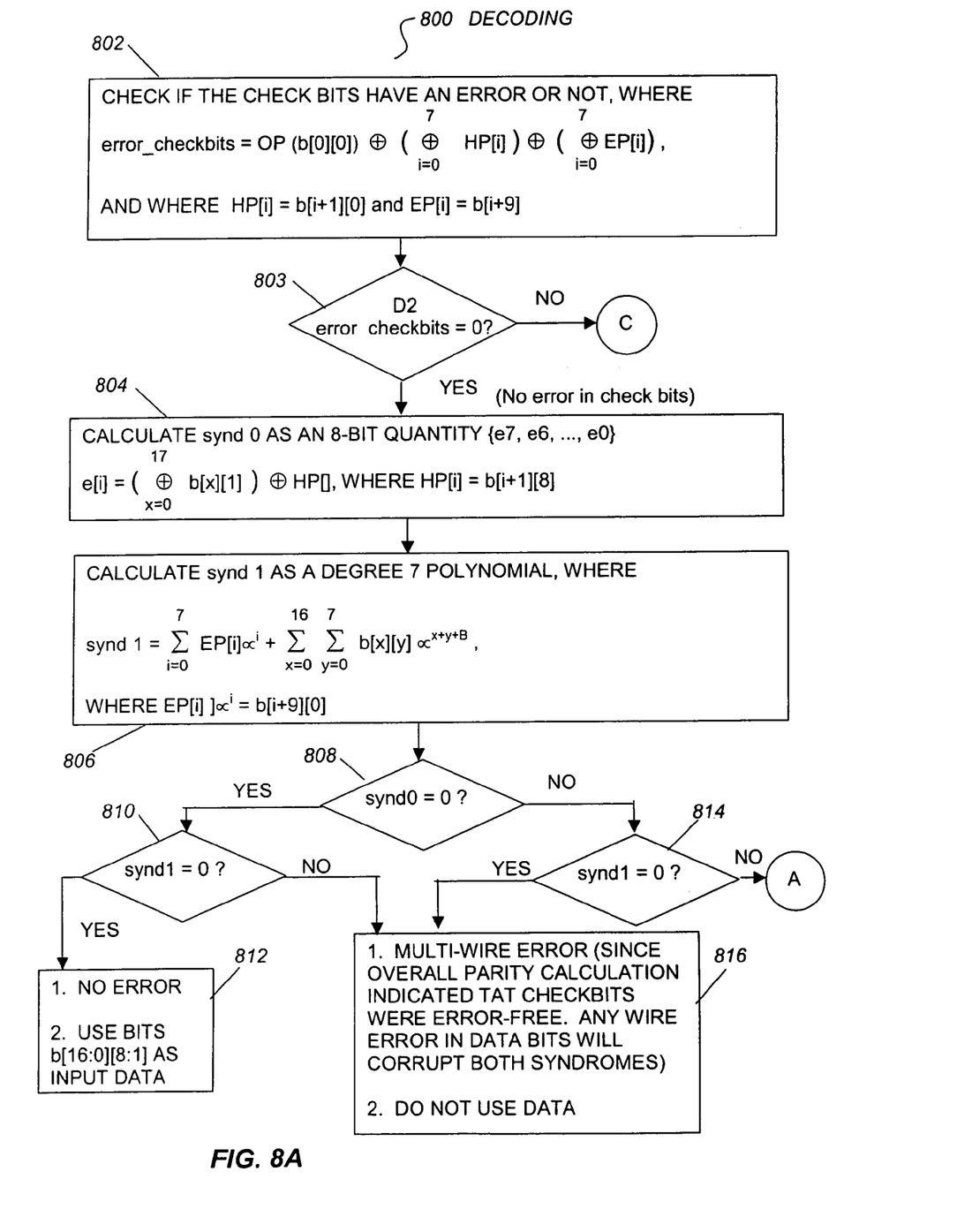
FIGS. 8A through 8D are flow charts of an exemplary method for decoding the ECC and information bits to perform single wire error correction for the in-wire method as encoded using the method shown in FIG. 7.

FIGS. 8A–D show a method for in-line error correction. Referring to FIG. 8A, the check bits are examined to determine whether there is an error, in step 802, such that $$error\_checkbits = OP\left(b[0][0] \oplus \left(\bigoplus_{i=0}^{17} HP[i]\right) \oplus \left(\bigoplus_{i=0}^{7} EP[i]\right)\right),$$

and where HP[i]=b[i+1][0] and EP[i]=b[i+9]. A determination is made as to whether there is an error in the check bits in step 803, and if not, then synd 0 is calculated in step 804 as $$e[i] = \left(\bigoplus_{x=0}^{18} b[x][i+1]\right) \oplus HP[i],$$

where HP[i]=b[i+1][07]. Synd1 is then calculated in step 806 as a degree 7 polynomial, where $$synd1 = \sum_{i=0}^{7} EP[i]\alpha^i + \sum_{x=0}^{16}\sum_{y=1}^{8} b[x][y]\alpha^{x+y-1+B},$$

and where EP[i]$\alpha^i$=b[i+9][0].

A determination is made as to whether synd0 is zero in step 808. A determination is made as to whether synd1=0 in steps 810 or 814. If synd0=0 and synd1=0 then there is no error and the bits b[16:0][8:1] are used in step 812. If synd0=0 and synd1≠0 then there is a multi-wire error since the overall parity calculation indicated that checkbits were error-free. Any wire error in data bits will corrupt both syndromes. It is determined in step 816 that this data is not to be used. If synd0≠0 and synd1≠0 then there is a multi-wire error as determined n step 816. However, if synd0≠0 and synd1≠0, then there is an error in one of the information wires that must be corrected and execution continues with FIG. 8B.

Figure 8B:
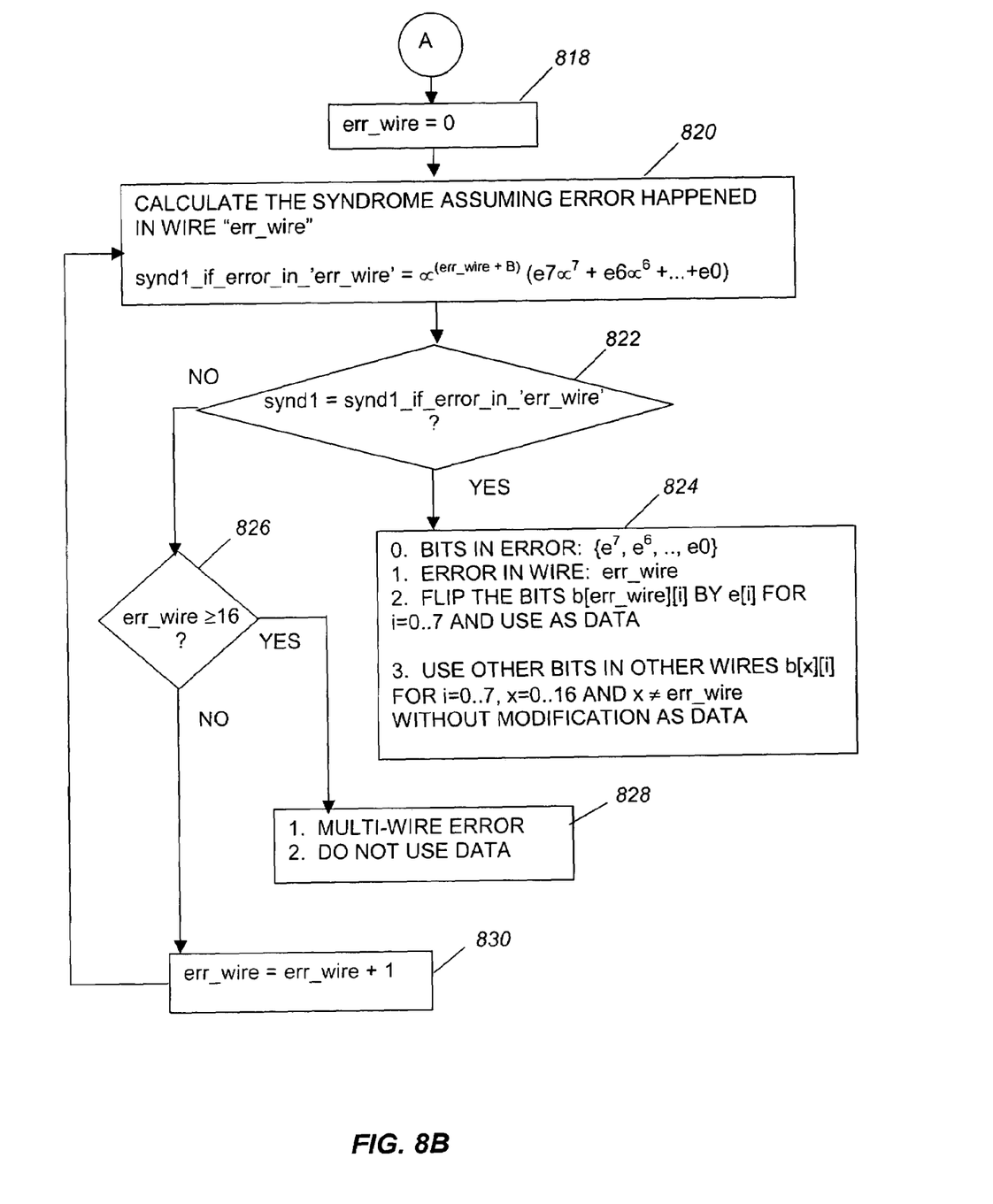

Referring now to FIG. 8B, the err_wire is initialized to wire 0 in step 818. This wire is assumed to be in error and the syndrome are now calculated as if the wire is in error. Synd1 is calculated as if in error in step 820 as $\alpha^{(err\_wire+B)}$ (e7$\alpha^7$+e6$\alpha^6$+e5$\alpha^5$+e4$\alpha^4$+e3$\alpha^3$+e2$\alpha^2$+e1$\alpha^1$+e0). IF the synd1 is equal to the synd1 with an assumed error, as determined in step 822, then the bits in error are {e7+1e6+1, ..., ei+1}. The errors are in wire=err_wire as determined in step 824. The bits in error b[err_wire][i+1] are flipped by e[i] for i=1 ... 7 and then the data is used.

Bits in other wires b[x][i] are used for i=1 ... 9 and x= 0 ... 16, where x≠err_wire, without modification.

IF the synd1 is not equal to the synd1 with an assumed error, as determined in step 822, then a determination is made as to whether err_wire is greater than or equal to 16, in step 826. If so, then there is a multi-wire error as determined in step 828 and the data is not used. If not, then err_wire is incremented by one in step 830 and the process continues with the calculation of the synd1_if_in_error in step 820.

If however, there is an error in the check bits, as determined in step 803, then err-wire_is set to zero in step 832.

Figure 8C:
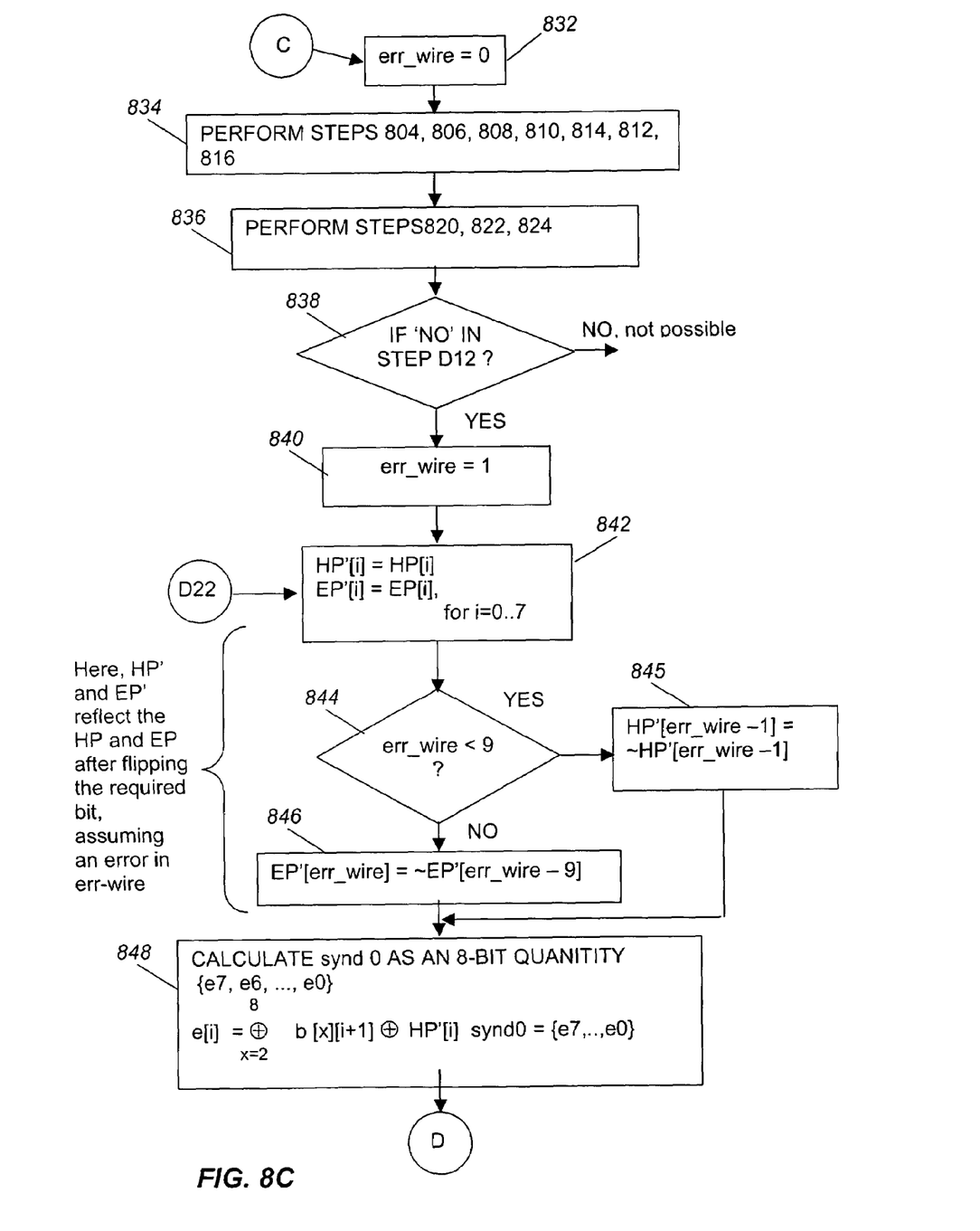

Then steps 804, 806, 808, 814, 810, 812, and 816 are performed in step 834. Instead of continuing at step 818, however, processing continues with step 836. In step 836, steps 820, 822, and 824 are performed. A determination was made as to whether synd1 is equal to the assumed error synd1 in step 822. This result is checked again in step 838. At this point, is should not be possible for this to be true because step 824 has already been performed. Thus, processing continues with step 840 where err-wire is set to one. A new set of horizontal parity and extended parity (HP' and EP') are calculated in step 842. Here, HP' and EP' reflect the HP and EP after flipping the required bit, assuming an error in err-wire.

Figure 8D:
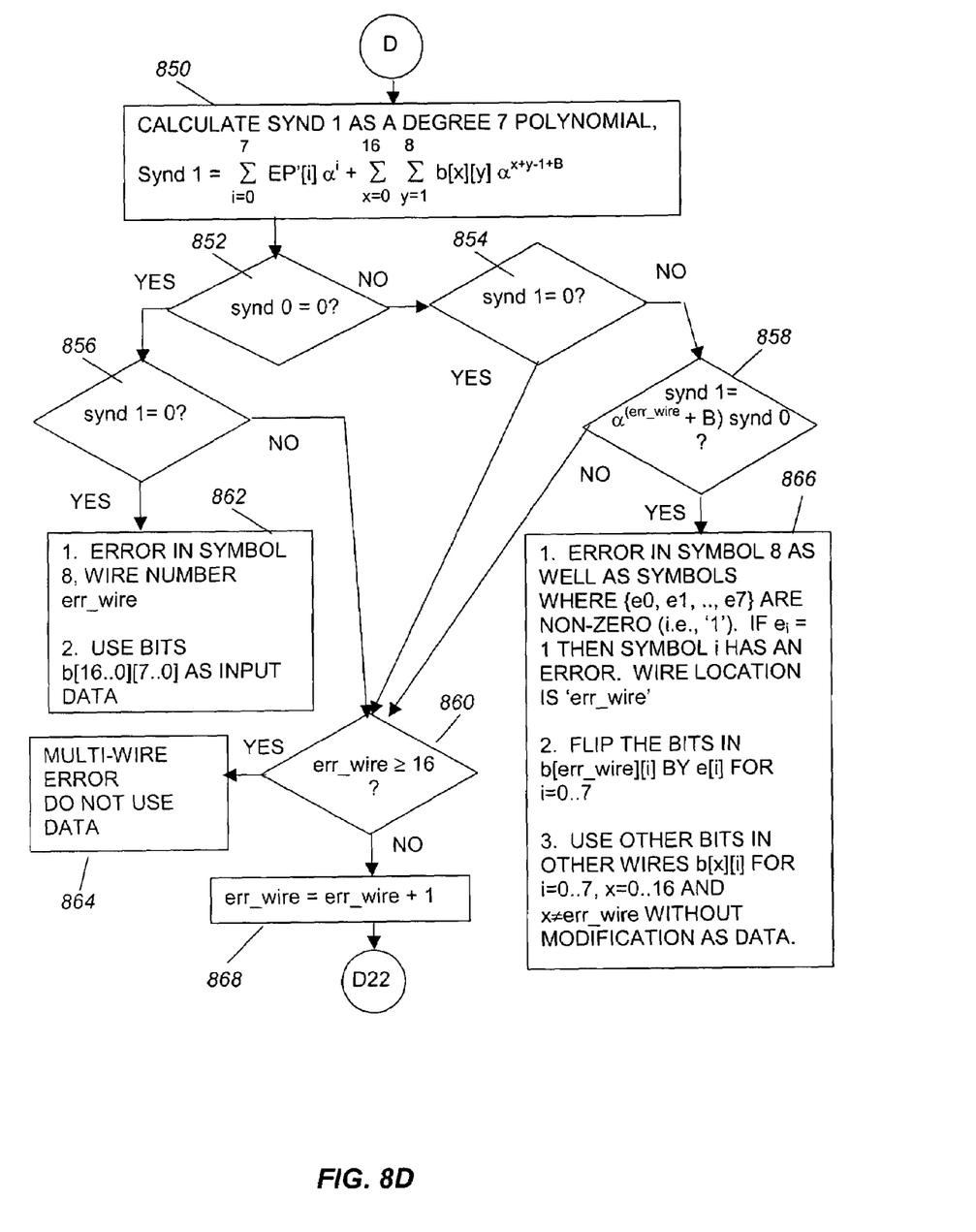

A determination is made as to whether err-wire is less than 9 in step 844. If so, then HP'[err-wire−1]=NOT HP'[err-wire−1] in step 845. Otherwise, EP'[err-wire]=NOT EP'[err-wire−9], in step 846. The synd0 is then calculated as an 8-bit quantity in step 848 and synd1 is calculated as a degree 7 polynomial in step 850. If synd0 is equal to zero, as determined in step 852, then if synd1 is also equal to zero, as determined in step 856, then there is an error in symbol 0 and wire number, err-wire. The bits b[16 . . . 0][8 . . . 1] are then used as input data in step 862. If synd0=0 AND synd1≠0, as determined in steps 852 and 856, then a determination is made as to whether all wires have been examines, i.e., whether err-wire≧16. If so, then there is a multi-wire error and the data is not used in step 864. IF synd0≠0 AND synd1=0, as determined in steps 852 and 854, then process continues with step 860 to determine whether the last wire has been corrected. If synd0≠0 AND synd1≠0, then a determination is made as to whether synd1 is equal to $\alpha^{(err-wire+B)}$synd0, in step 858. If not, then a determination is made as to whether all wires have been examined in step 860. Otherwise, there is an error in symbol 0, as well as, symbols where {e0, e1, . . . , e7} are non-zero. If $e_i$=1, then symbol $e_{i+1}$ has an error. The wire location is err-wire. The bits b[err-wire][i+1] are then flipped by e[i] for 1=1 . . . 7, in step 866. Other bits in other wires b[x][i] are then used for i=1 . . . 8, x=0 . . . 16 and x≠err-wire without modification, as data. If processing has continued with a determination of whether all wires have been examined in step 868, and they have not, then processing continues again at step 842, where the horizontal and extended parities are recomputed based on flipped bits.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

The invention claimed is:

1. A method for in-line error detection and correction using wires 0 to k−1, and symbols 0 to n, said method comprising steps of:
    calculating a horizontal parity (HP[i]) for i=0 to n−2, where n is a number of symbols used, and $$HP[i] = \bigoplus_{x=0}^{k-1} b[x][i],$$

and k is a number of wires used;
    calculating an extended parity $$(EP) = \sum_{x=0}^{k-1} \sum_{y=0}^{n-1} b[x][y]\alpha^{(x+y+B)},$$

where B a degree of primitive polynomial+1 and a number of bits in a syndrome;

sending contents of the horizontal parity along wire 0 of k wires, where HP[0] is in symbol 0, HP[1] is in symbol 1, . . . , HP[n−2] is in symbol n−2;
calculating an overall parity (OP) where the OP is an exclusive-or of the horizontal and extended parities;
sending check bits along the wires in symbol 0, wherein the check bits comprise the extended parity, the horizontal parity and the overall parity;
sending information bits in symbols 1 . . . n−1, wherein symbol[i] carries bits b[k−1 . . . 0][i];
determining whether check bits have an error;
calculating a syndrome 0 and a syndrome 1, wherein syndrome 0 is a B-bit quantity {eB−1, . . . , e2, e1, e0} such that $$e[i] = \bigoplus_{x=0}^{k} b[x][i+1] \oplus HP[i],$$

where HP[i]=b[i+1][0 . . . 7], and wherein syndrome 1 is a summation of the extended parity and seven degree polynomial;
determining whether bit i in wire j contains an error; and
if bit i in wire j contains an error, then fixing the bit error by flipping the erroneous bit.

2. A method for in-line error detection and correction using wires 0 to k−1, and symbols 0 to n, where information bits and symbols are sent along wires 0 to k, said method comprising steps of:
    calculating check bits from information bits, wherein the check bits comprise horizontal parity, extended parity and overall parity of the information;
    sending the check bits along wires 0 to k−1, wherein information is sent along the same wires;
    determining whether an error exists in the sent information using syndromes generated from the check bits, wherein syndrome 0 is obtained from the horizontal parity (HP) bits by taking an exclusive-OR (XOR'ing) of the information bits with the HP bits and wherein syndrome 1 comprises a degree n−1 polynomial; and
    correcting single wire errors determined using the syndromes.

3. The method as recited in claim 2, wherein the horizontal parity (HP[i]), for i=0 to n−2, is $$HP[i] = \bigoplus_{x=0}^{k-1} b[x][i],$$

where n is a number of symbols used, and k is a number of wires used, and wherein the extended parity (EP) is $$\sum_{x=0}^{k-1} \sum_{y=0}^{n-1} b[x][y]\alpha^{(x+y+B)},$$

where B a degree of primitive polynomial+1 and a number of bits in a syndrome.

4. The method as recited in claim 3, wherein contents of the horizontal parity are sent along wire 0 of k wires, where HP[0] is in symbol 0, HP[1] is in symbol 1, . . . , and HP[n−2] is in symbol n−2.

5. An apparatus for in-line error detection and correction using wires 0 to k−1, and symbols 0 to n, comprising:

an encoder for calculating a horizontal parity (HP), extended parity (EP) and overall parity (OP) for information bits, wherein the horizontal parity (HP[i]) for i=0 to n−2, where n is a number of symbols used, and $$HP[i] = \bigoplus_{x=0}^{k} b[x][i],$$

and k is a number of wires used, and wherein the extended parity $$(EP) = \sum_{x=0}^{k-1} \sum_{y=0}^{n-1} b[x][y]\alpha^{(x+y+B)},$$

where B a degree of primitive polynomial+1 and a number of bits in a syndrome, and wherein the overall parity (OP) is an exclusive-or of the HP and the EP;

means for sending the information bits and calculated parity bits across wires 0 to k, wherein check bits are sent along the wires in symbol 0, wherein the check bits comprise the extended parity, the horizontal parity and the overall parity, and wherein information bits are sent in symbols 1 . . . n−1, where symbol[i] carries bits b[k−1 . . . 0][i], and wherein horizontal parity (HP) is sent along wire 0, where HP[0] is in symbol 0, HP[1] is in symbol 1, . . . , HP[n−2] is in symbol n−2;

means for determining whether check bits have an error, comprising decoder for calculating a syndrome 0 and a syndrome 1, wherein syndrome 0 is a B-bit quantity {eB−1, . . . , e2, e1, e0} such that $$e[i] = \bigoplus_{x=0}^{17} b[x][i+1] \oplus HP[i],$$

where HP[i]=b[i+1][0 . . . 7], and wherein syndrome 1 is a summation of the extended parity and seven degree polynomial; and means for fixing bit errors determined by the determining means.

6. An apparatus for in-line error detection and correction using wires 0 to k−1, and symbols 0 to n, comprising:

an encoder for calculating check bits from information bits, wherein the check bits comprise horizontal parity, extended parity and overall parity of the information;

a transmitter for sending the check bits along wires 0 to k−1, wherein information is sent along the same wires;

means for determining whether an error exists in the sent information using syndromes generated from the check bits, wherein syndrome 0 is obtained from the horizontal parity (HP) bits by taking an exclusive-OR (XOR'ing) of the information bits with the HP bits and wherein syndrome 1 comprises a degree n−1 polynomial; and error correction component for correcting single wire errors determined using the syndromes.

7. The apparatus as recited in claim 6, wherein the horizontal parity (HP[i]), for i=0 to n−2, is $$HP[i] = \bigoplus_{x=0}^{k} b[x][i],$$

where n is a number of symbols used, and k is a number of wires used, and wherein the extended parity (EP) is $$\sum_{x=0}^{k-1} \sum_{y=0}^{n-1} b[x][y]\alpha^{(x+y+B)},$$

where B a degree of primitive polynomial+1 and a number of bits in a syndrome.

8. The apparatus as recited in claim 7, wherein contents of the horizontal parity are sent along wire 0 of k wires, where HP[0] is in symbol 0, HP[1] is in symbol 1, . . . , and HP[n−2] is in symbol n−2.

* * * * *

UNITED STATES PATENT AND TRADEMARK OFFICE
CERTIFICATE OF CORRECTION

PATENT NO. : 7,096,414 B2
APPLICATION NO. : 10/632908
DATED : August 22, 2006
INVENTOR(S) : Debendra Das Sharma It is certified that error appears in the above-identified patent and that said Letters Patent is hereby corrected as shown below:

In column 3, line 6, delete "ax" and insert -- $\alpha$ --, therefor.

In column 6, line 13, after "adding the" delete "ey" and insert -- $e_y$ --, therefor.

In column 6, line 48, after "extended" delete "parit" and insert -- parity (EP) is --, therefor.

In column 7, line 19, after "steps 607 or 609" delete "If synd0=1" and insert -- If synd0=0 --, therefor.

In column 7, line 31, delete "$e5\alpha^1$" and insert -- $e5\alpha^5$ --, therefor.

In column 7, line 62, delete "$\alpha^{x+B}$." and insert -- $\alpha^{i+B}$. --, therefor.

Signed and Sealed this

Twelfth Day of January, 2010

David J. Kappos
*Director of the United States Patent and Trademark Office*